(12) United States Patent
Lechner

(10) Patent No.: US 7,142,433 B2
(45) Date of Patent: Nov. 28, 2006

(54) METHOD OF EMBEDDING AT LEAST ONE FLEXIBLE CONDUCTIVE TRACK FOIL, A CONDUCTIVE TRACK UNIT AS WELL AS AN EMBEDDING UNIT THEREFOR

(75) Inventor: Johannes Lechner, Kirchberg/Walde (AT)

(73) Assignee: Pollmann Austria OHG, Karlstein An Der Thaya (AT)

( * ) Notice: Subject to any disclaimer, the term of this patent is extended or adjusted under 35 U.S.C. 154(b) by 140 days.

(21) Appl. No.: 10/066,808

(22) Filed: Feb. 4, 2002

(65) Prior Publication Data
US 2002/0109264 A1    Aug. 15, 2002

(30) Foreign Application Priority Data
Feb. 9, 2001    (AT)    ................ A 201/2001

(51) Int. Cl.
H05K 7/14    (2006.01)
H05K 7/18    (2006.01)

(52) U.S. Cl. ............. 361/797; 361/800; 361/752; 174/74; 174/250

(58) Field of Classification Search .......... 361/797, 361/752, 715, 800, 713, 746, 749; 174/74, 174/250, 71, 260, 261, 150
See application file for complete search history.

(56) References Cited

U.S. PATENT DOCUMENTS

| | | | |
|---|---|---|---|
| 4,710,419 A * | 12/1987 | Gregory | 428/210 |
| 4,814,943 A * | 3/1989 | Okuaki | 361/783 |
| 4,821,413 A | 4/1989 | Schmitt et al. | |
| 5,173,840 A | 12/1992 | Kodai et al. | |
| 5,570,272 A * | 10/1996 | Variot | 361/723 |
| 5,959,366 A | 9/1999 | Menke | 307/10.1 |
| 6,128,195 A | 10/2000 | Weber et al. | |
| 6,239,372 B1 | 5/2001 | Gartner et al. | 174/74 |
| 6,268,561 B1 * | 7/2001 | Buscella | 174/52.2 |
| 6,285,561 B1 * | 9/2001 | Aflenzer et al. | 361/767 |

FOREIGN PATENT DOCUMENTS

| | | |
|---|---|---|
| DE | 4407508 A1 | 9/1995 |
| DE | 19732224 | 2/1999 |
| DE | 19907295 C1 | 2/2001 |
| EP | 0511014 A1 | 10/1992 |
| EP | 0641154 A1 | 3/1995 |
| EP | 0708583 A1 | 4/1996 |
| EP | 0784418 | 7/1997 |
| EP | 0784418 A2 | 7/1997 |

OTHER PUBLICATIONS

European Application 0641154 A1, dated Mar. 1, 1995.
German Patent 19907295 C1, dated Feb. 8, 2001.
European Patent Application 0708583 A1, dated Apr. 24, 1996.
European Patent Application 0784418 A2, dated Jul. 16, 1997.
German Patent Application 4407508 A1, dated Sep. 14, 1995.

* cited by examiner

Primary Examiner—Randy W. Gibson
(74) Attorney, Agent, or Firm—Ladas & Parry LLP

(57) ABSTRACT

A method of embedding at least one flexible conductive track foil in a plastics material, wherein a prefabricated stiffening element is provided, said stiffening element accommodates said at least one flexible conductive track foil and secures it against bending, and said plastics material is injection-molded around said flexible track foil and said stiffening element in an injection-mold.

41 Claims, 10 Drawing Sheets

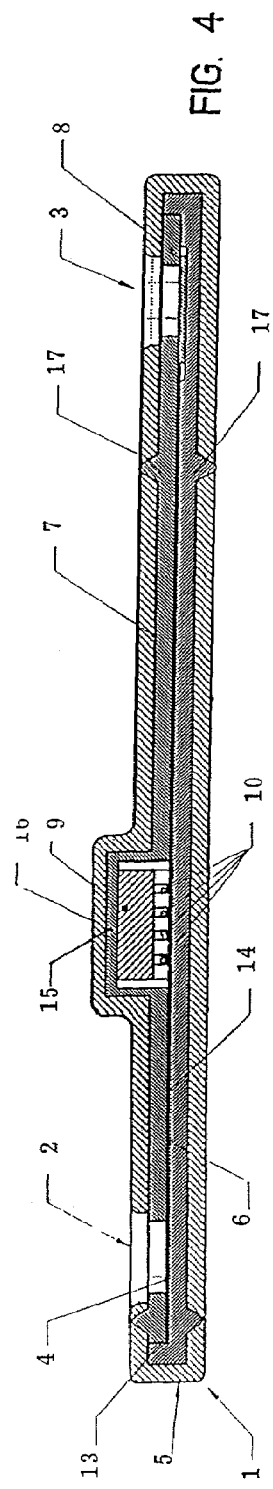
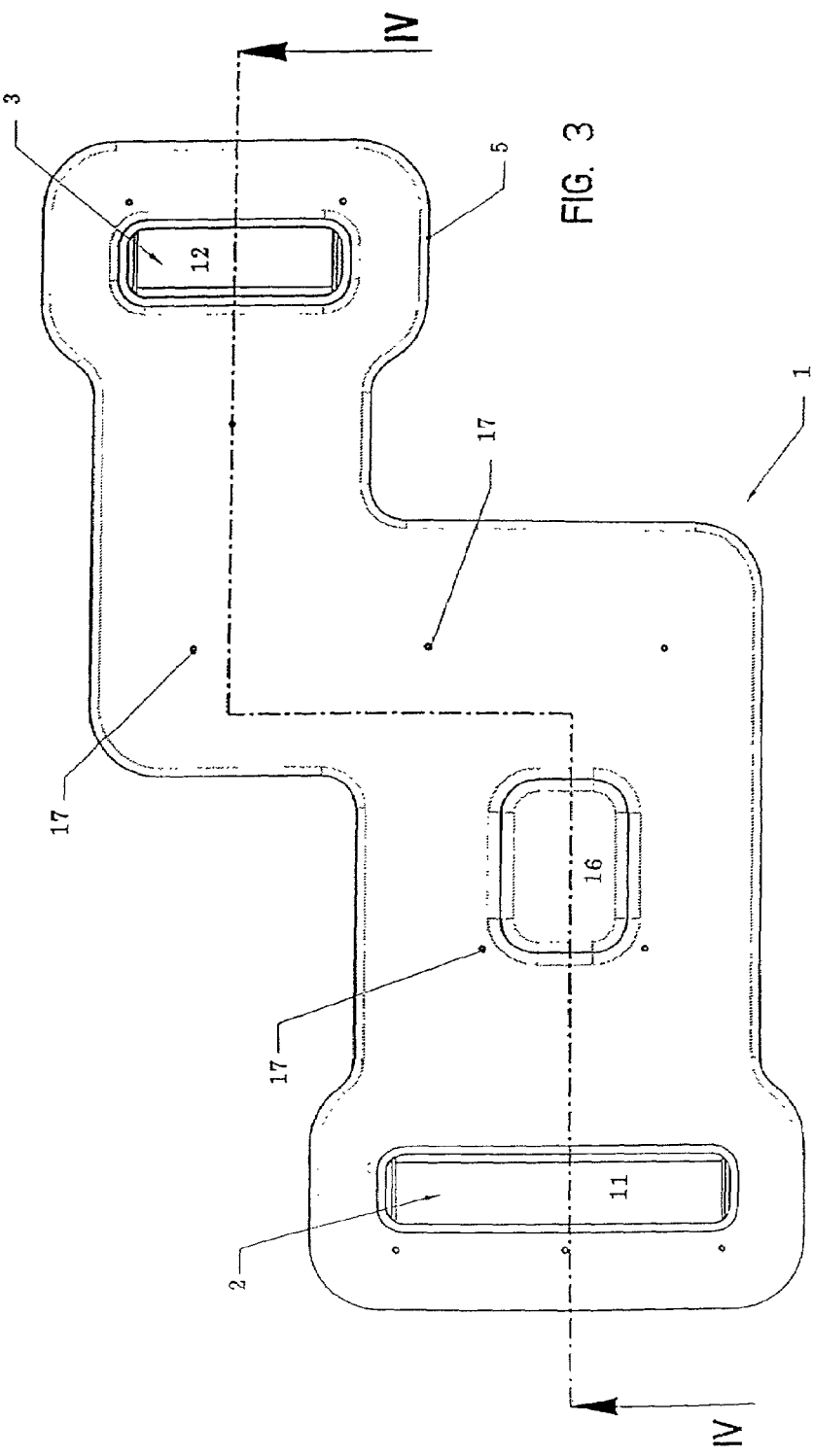

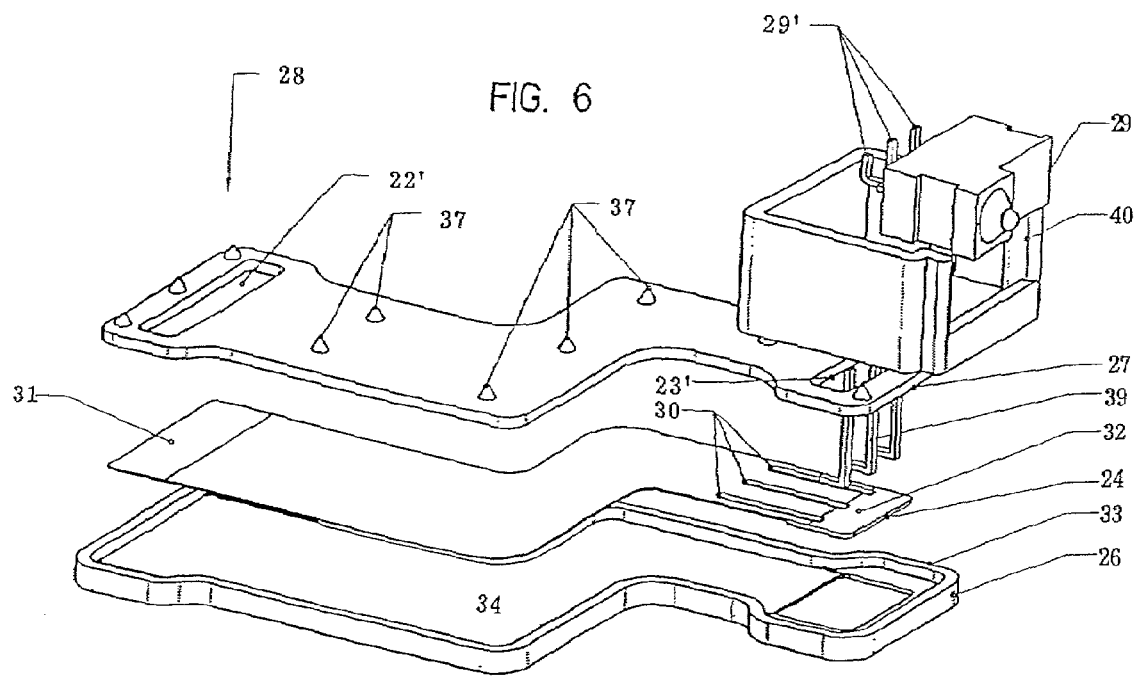

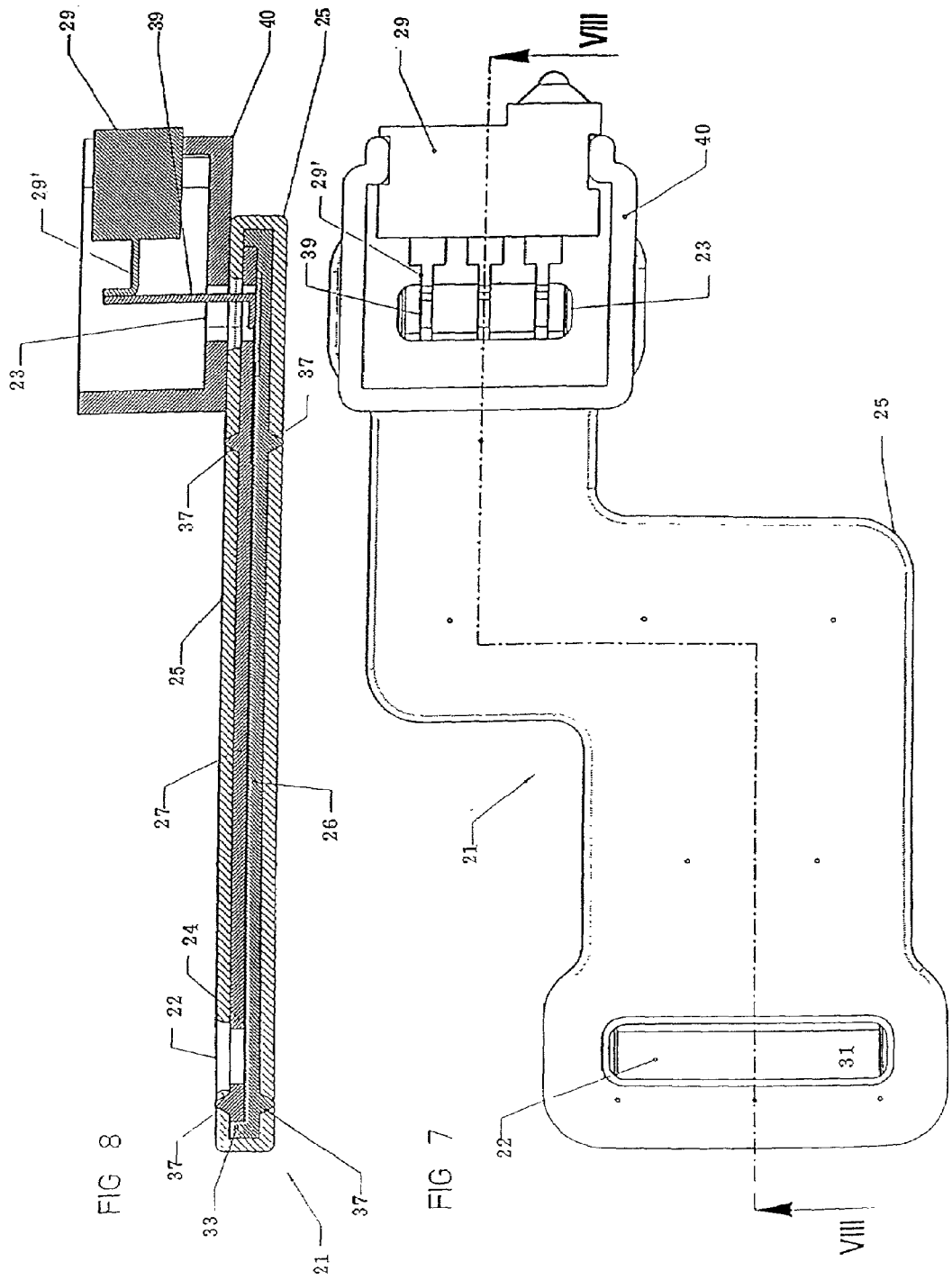

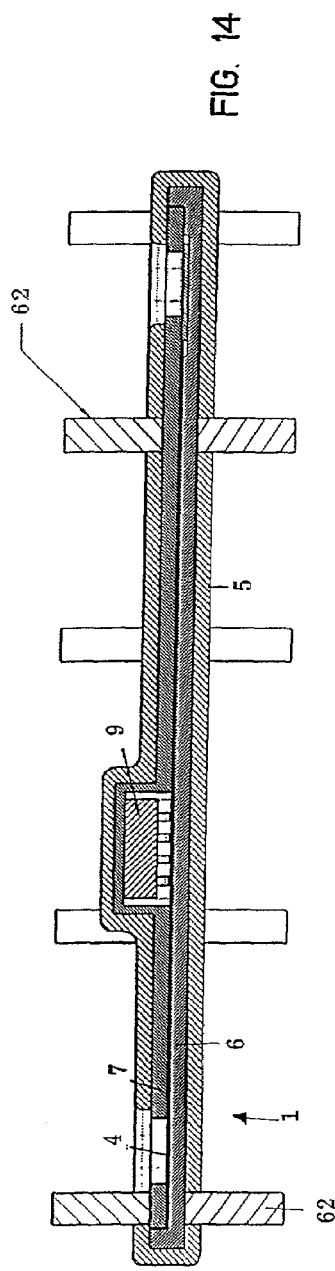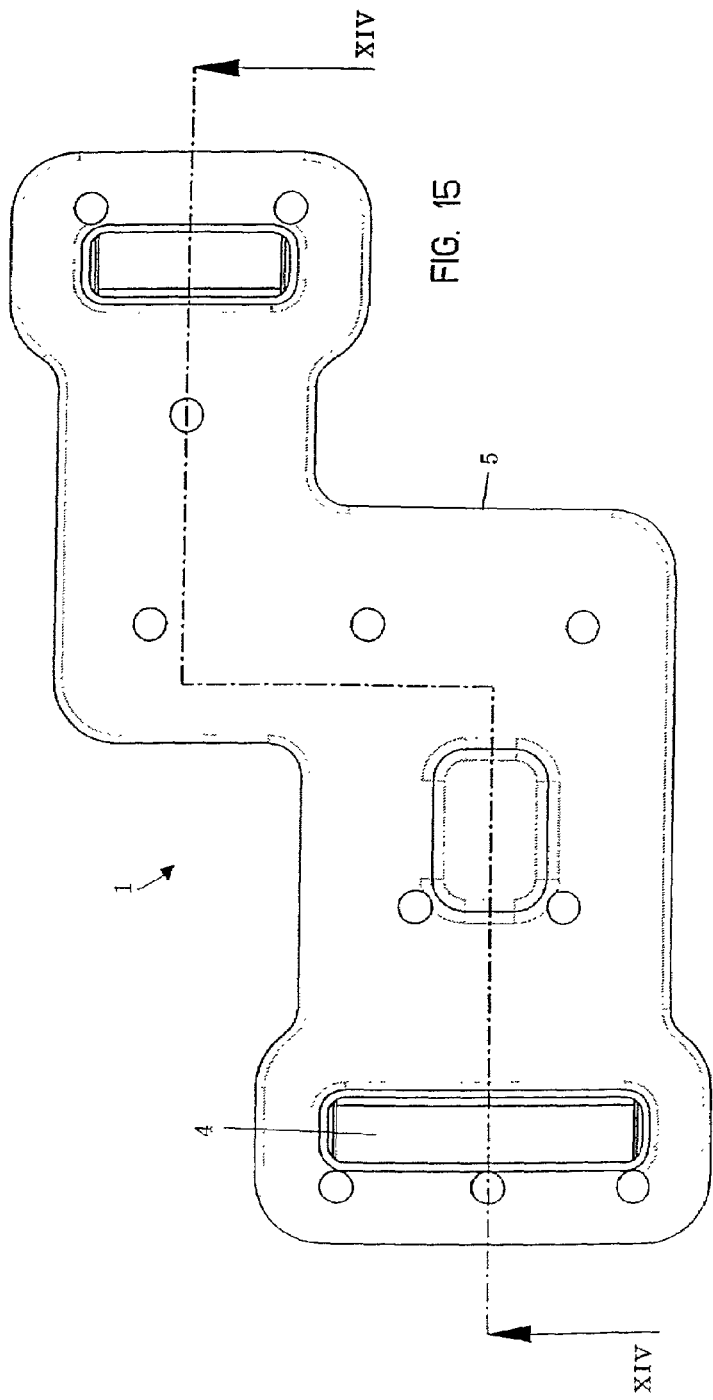

METHOD OF EMBEDDING AT LEAST ONE FLEXIBLE CONDUCTIVE TRACK FOIL, A CONDUCTIVE TRACK UNIT AS WELL AS AN EMBEDDING UNIT THEREFOR

FIELD OF THE INVENTION

The invention relates to a method of embedding at least one flexible foil-type circuit board in plastics.

Likewise, the invention relates to a foil-type electric circuit board unit comprising at least one plastics-embedded foil-type circuit board; the unit may also comprise at least one plastics-embedded component, e.g. an electrical or electromechanical component.

Moreover, the invention relates to an embedding unit to be used in the method according to the invention.

BRIEF DESCRIPTION OF THE BACKGROUND ART

From EP 784 418 A, it is known to produce three-dimensional molded conductor bodies by injection molding, starting from a printed circuit board which is furnished with electrical components, e.g. SMD (surface mounted device) components, and which is re-shaped at a bending site prior to being embedded by injection-molding with plastics to thereby place light-emitting diodes at this site towards the outer side of the molded conductive body. The printed circuit board is substantially stiff so that the bending-reshaping as well as the embedding or injection-molding with plastics does not pose any problems. In the course of miniaturizing components, it is increasingly desired to use thin, flexible conductive track foils, i.e. foil-type circuit boards, instead of relatively thick printed circuit boards with conductive tracks applied thereon, the flexible conductive track foils moreover having the advantage that the most varying conductive track configurations can be realized by mass production in an extremely narrow space on such conductive track foils. An example of using such conductive track foils is disclosed in DE 197 32 223 A, where insulating material is applied between the conductive tracks and the conductive track foil as a whole is arranged in a function integration module.

It would be desirable to be able to inject plastics around such conductive track foils similar to other conductive structures so as to attain a hermetic seal, in particular for applications in automobile doors and the like. Yet because of the flexibility of the conductive track foils, this is not easily possible because when the hot plastics material is injected in the injection-molding die, the—unstable—conductive track foil would bulge under pressure in the free regions where it is to be kept at a distance from the mold surfaces, resulting in a displacement of the conductive track foil, and even in a tearing of the conductive track foils. Therefore, it has also been attempted to inject plastics material around conductive track foils such that the conductive track foil in a first step is caused to lie against a surface of the injection mold and the plastics material is injected onto the oppositely arranged side of the conductive track foil, and that after this plastic material has become hard, the obtained product comprised of the conductive track foil with the plastics molded onto one side thereof is brought into another injection mold where it is caused to lie against a mold surface with its plastics side, whereupon the still plastics-free second side of the conductive track foil is injection-molded with plastics. However, this procedure is cumbersome and complex since complete different injection-molding dies are required to carry out the injection-molding (wherein also a cooling step must be provided between the two injection steps so as to allow the plastics material injected thereon in the first step to become sufficiently hard), and it is also detrimental because the conductive track foils, particularly with components mounted thereto, are twice subjected to the stress by pressure and temperature when plastics material is injection-molded thereon.

SUMMARY OF THE INVENTION

It is an object of the invention to provide a technology for embedding of conductive track foils in plastics material in as simple a manner as possible, without exposing the conductive track foil to the threat of a damage.

In particular, it is an object of the invention to render it possible to use conductive track foils of a less solid and temperature-resistant material than has hitherto been required and to obtain, nevertheless, hermetically closed, compact, comparatively thin conductive track units.

According to the present invention in a preferred embodiment, a prefabricated stiffening element, in particular in the form of a casing, is used to safeguard the conductive track foils against a displacement and bending within the injection molding die when they are embedded in plastics material. In principle, it would be conceivable to design this stiffening element substantially plate-shaped, with the stiffening element then being capable of being connected on one side with the conductive track foil, e.g. by gluing at individual points. If, however, the conductive track foil is inserted between two casing parts, the foil is protected from both sides right from the start against the relatively high pressures and temperatures prevailing in the injection-molding tool while being embedded in the injected synthetic material, wherein, nevertheless, also comparatively extremely thin units having a thickness of e.g., approximately 4 mm or less, may be obtained. By protecting the conductive track foil from the pressure and temperature of the plastics material in this manner, it is also possible to use comparatively inexpensive and less temperature resistant and less pressure resistant foil materials. The stiffening element or casing may simply be prefabricated and stored in the appropriate number of items so that it will be immediately available upon demand, whereby the embedding procedure proper, i.e. the injecting of plastics material around the conductive track foil, can be carried out rapidly and without any delay. The stiffening element, or casing, respectively, may stably be held in the desired position within the injection mold, in contrast to a simple conductive track foil which per se would be too unstable and would "float" within the injection mold.

Electrical and/or electromechanical components, such as sensors, micro-switches, and, in particular, SMD components (SMD=surface mounted device) may be mounted to the flexible conductive track foils before the plastics material is injected, and to protect these components during the injection procedure, the stiffening element, or casing, respectively, may be configured with an e.g. hood-shaped receiving space. Moreover, the stiffening element, in particular the casing, may be prefabricated with external spacer elements so as to maintain the stiffening element including the conductive track foil in the injection mold at a distance from the mold surfaces. In this manner it is possible to design the injection mold itself to be simple. On the other hand, however, it is suitable in many instances if supporting cores are used in the injection mold when the stiffening element inclusive of the conductive track foil are embedded in the plastics so as to keep the stiffening element at a distance from the mold surfaces of the injection mold.

Within the scope of the invention, also sandwich structures may be produced, wherein several flexible conductive track foils with associated stiffening elements are arranged one above the other and the plastics material is injected therearound. Here, too, the advantage that the stiffening elements secure the conductive track foils against floating in the injection mold and stabilize them is obtained, whereby an embedding of the sandwich structure in a thin plastics enclosure is possible.

For an embedding of the conductive track foils including the stiffening elements, a thermoplastic material as per se is common may be used, such as, in particular, polybutylene terephthalate (PBT) or polypropylene (PP), with other thermoplastics, such as ABS, being usable, too. It is also conceivable to use duroplastic materials.

For the conductive track foils, however, an inexpensive polyester material may be used. Of course, also e.g. polyimide foils are usable.

If components of larger dimensions or with the necessity of access from the outside of the module produced are to be provided, such as, e.g., a micro-switch with a mechanical "inquiry", it is also advantageous to provide a separate receiving space for these components; preferably, a receiving part for such a component may be produced by co-injection molding when embedding the stiffening element during the injection procedure.

Moreover, for the purpose of contacting, it is also conceivable to bend over the flexible conductive track foil in regions before plastics material is injected therearound, and to fix it by this bent region on an, e.g., web-shaped, projection of the stiffening element. In doing so it is, moreover, suitable if a ring element is slipped onto the bent region with clamping, to secure the bent region of the flexible conductive track foil on the projection of the stiffening element after injecting the plastics material, leaving free this region.

As already mentioned, preferably a casing having an inner space to receive the flexible conductive track foil is provided as the stabilizing stiffening element which safeguards against bending; the casing may be formed in one part with a slit-type inner space accessible from one side, yet this may pose problems in terms of production technique and does not allow the conductive track foil to be previously equipped with components. Therefore, the casing preferably comprises several parts, in particular two parts, one casing part possibly being a trough part in which the conductive track foil will be inserted, and the other casing part being a lid part which subsequently will be placed onto the trough part. The two casing parts may be prefabricated as separate parts; it is, however, also conceivable to provide the two casing parts in one piece, in which case they will be interconnected via a film-type, integral hinge so that they can be folded together into the closed position.

Thus, the invention does not only provide for an advantageous method for embedding a conductive track foil in plastics material by injection-molding in one single step as well as an electric conductive track foil unit comprising such a conductive track foil, but, moreover, the invention also provides a prefabricated casing comprising two matching casing parts between which the receiving space for the conductive track foil is provided, as an embedding unit to be used in the method according to the invention. In at least one casing part, at least one window may be kept free for an access to contact the conductive track foil, and in alignment therewith, in the finished conductive track unit also a window may be left free in the embedding material during the injection procedure. By these aligned windows, thus, the respective conductive tracks or contact surfaces of the conductive track foil may be contacted. Contacting itself is conventional and is not a subject of the present invention.

The spacer elements used to keep the stiffening element, in particular the casing, with the conductive track foil at a distance from the mold surfaces of the injection mold may, e.g., be knob-shaped, and they may be distributed over the entire (outer) surface of the stiffening element, or casing, respectively. The spacer elements suitably have the same height, and this height may be dimensioned such that after the embedding step, all spacer elements end flush with the outer side of the plastics embedding material.

Finally, mention should be made of DE 44 07 508 A1 in which a method of embedding electrically conductive tracks in plastics material is described; here, however, conductive tracks in the form of punched grids are provided which as such form a stable unit, with molded parts previously being put onto these punched grids which will hold the respective punched grid also if connecting webs between the conductive portions of the punched grid are separated, before injection of the plastics material is effected. These molded parts may be fixed on the punched grid by clamping. Such a clamping fixation would, of course, not be possible in case of conductive track foils and, moreover, in the case of conductive track foils, such molded parts extending over only a part of the punched grid would not be able to ensure the required stability of the entire conductive track foil, either.

BRIEF DESCRIPTION OF THE DRAWINGS

In the following, the invention will be explained in more detail by way of preferred exemplary embodiments illustrated in the drawings to which, however, it shall not be restricted.

FIG. 3 shows a top view on the conductive track unit according to FIG. 1 after injection-molding has been finished;

FIG. 4 shows a representation of a section through this conductive track unit according to section line IV—IV of FIG. 3;

FIG. 6 shows the individual elements, i.e. the casing parts, the conductive track foil, the micro-switch and the receiving part therefor, in an exploded view, prior to being embedded in the plastics;

FIG. 7 shows a top view onto the conductive track unit according to FIG. 5;

FIG. 8 shows a longitudinal section through this conductive track unit according to section line VIII—VIII of FIG. 7;

FIGS. 14 and 15, respectively, show a sectional representation and a top view of a conductive track unit like that of FIGS. 1–4, wherein, however, supporting cores are used for fixing purposes in the injection mold during the embedding procedure.

DESCRIPTION OF PREFERRED EMBODIMENTS

Figure 1:
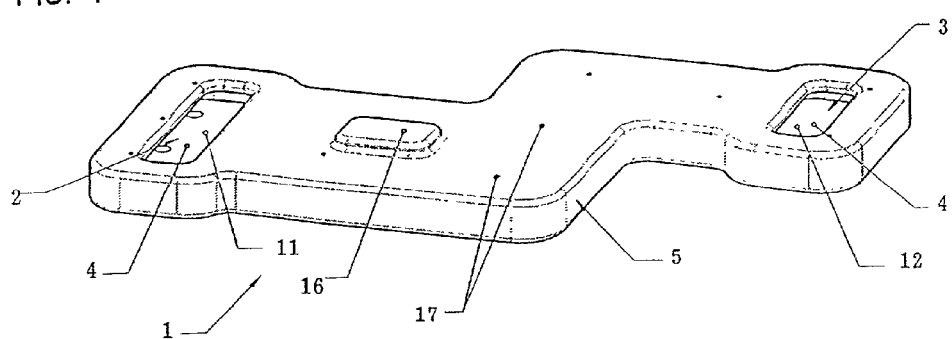
FIG. 1 is a view of a simplified electrically conductive track unit in which a conductive track foil is injection-embedded in plastics material, to illustrate the specifically preferred embodiment of the invention.

In FIG. 1, an electrical conductive track unit 1 is shown which comprises a conductive track foil 4 embedded in plastics 5 and to be contacted via windows 2, 3. The plastics material is injected around the conductive track foil 4 in an injection-molding procedure well-known per se, and for this purpose, the conductive track foil 4 is stiffened by a stiffening element and thus stabilized and retained against floating or displacements in the injection mold during the injection-molding procedure, whereby also a local bulging and breaking or rupturing of the conductive track foil 4 is avoided.

Figure 2:
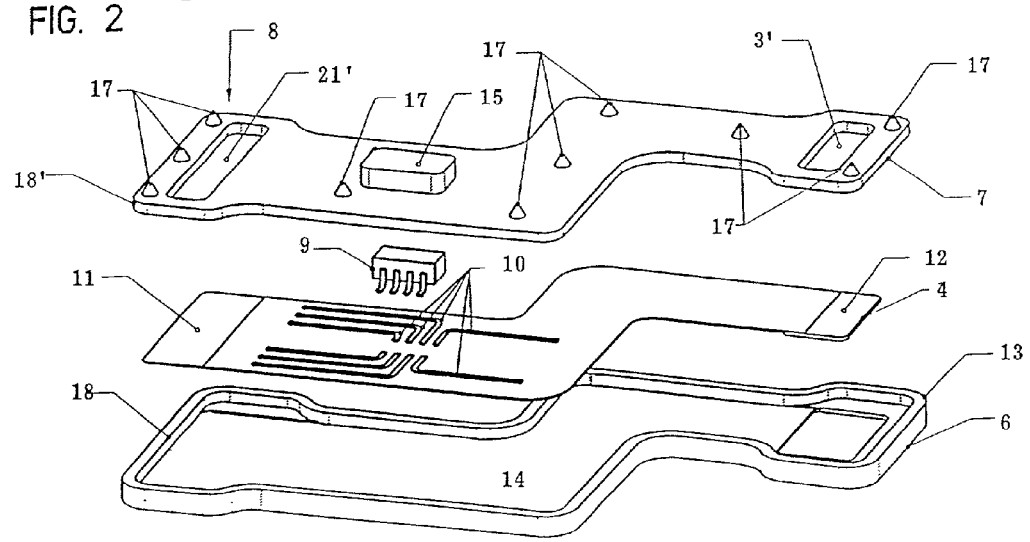
FIG. 2 shows the conductive track foil between two casing parts before plastics is injected around during the production of a conductive track unit according to FIG. 1, in an exploded view.

In detail, as is apparent from FIG. 2, a stiffening element in the form of a casing 8 comprised of two casing parts 6, 7 is provided, with the conductive track foil 4 being accommodated between these two casing parts 6, 7, i.e. enclosed therebetween, cf. also the representation in FIG. 4. For the sake of simplicity, only one electrical component, e.g. an SMD component 9, is illustrated in the exemplary embodiment shown in FIGS. 2 and 4, which SMD component 9 is soldered to the conductive track foil 4 or fastened thereto by crimping, with electric contacts being made to conductive tracks 10 provided on the conductive track foil 4 that is made, e.g., of a polyester film or a polyimide film. The conductive tracks 10 are continued to form contact surfaces not illustrated in detail in FIG. 2 in end regions 11, 12 of the conductive track foil 4, as is usual, and in the finished conductive track unit 1 (cf. FIG. 1), these end regions 11, 12 can be contacted through the contact windows 4 which, however, is a conventional technique and need not be explained in detail here.

The one casing part 6 is more or less trough-shaped so as to allow for the conductive track foil 4 to be laid into the inner space or receiving space provided thereby, with the shape of the casing part 6, 7, apart from the upwardly projecting rim 13 of the trough-shaped casing part 6, substantially corresponding to the shape of the conductive track foil 4. Then the lid-shaped upper casing part 7 is inserted on top of the conductive track foil 4 into the lower trough-shaped casing part 6, cf. also FIG. 4 in addition to FIG. 2. The inner space in the casing 8 for receiving the conductive track foil 4 is denoted by 14 in FIG. 4 just as in FIG. 2. From FIGS. 2 and 4 it is, moreover, apparent that the upper lid-shaped casing part 7 is shaped with a receptacle 15 in the form of a protective hood so as to provide for a protective space for the component 9. When the casing 8 in its assembled state and with the conductive track foil 4 inserted therein, cf. FIG. 4, has been injected around with the plastics material 5, a module having a bulge 16 at the site of this protective hood 15 is obtained, as is apparent from FIG. 1 and also from FIGS. 3 and 4. On the upper side of the protective hood 15, in the region of the bulge 16, the plastics material may be extremely thin-walled so that, if the enclosed component 9 is a sensor, such as, e.g., a Hall sensor, a high reaction sensitivity relative to external influences (which are to be sensed) will be ensured. Moreover, it is apparent from FIGS. 2 and 4 that the two casing parts 6, 7 at their respective outer sides are formed with spacer elements 17 in the form of knobs (the knob-like spacer elements 17 provided on the lower casing part 6, at the lower side thereof, are visible in FIG. 4, whereas in FIG. 2 the lower side is hidden as a consequence of the particular illustration); these spacer elements 17 serve to keep the casing 8 with the conductive track foil 4 inserted in its inner space 14 (and the components 9 mounted thereto), at a defined distance from the mold inner surfaces (not shown) while the plastics material is injected therearound. Accordingly, all these spacer elements 17 preferably also have the same height, and when injection-molding to embed the conductive track unit 1 has been finished, they end flush with the outer surface of the plastics embedding enclosure 5, as is particularly apparent from FIG. 4, yet as is also indicated in FIG. 1 by the point-like indicated tips of the conical knob-like spacer elements 17.

Furthermore, as is illustrated in FIGS. 2 and 4, the upper lid-shaped casing part 7 has corresponding windows 2', 3', these windows 2', 3' being kept free when the plastics material is injected, to thus obtain the aforementioned windows 2, 3 for contacting the conductive track foil 4 in the finished conductive track unit 1. For this purpose, of course, the injection mold has corresponding projections (not shown).

As is directly visible, the casing 8 reliably protects the conductive track foil 4 during the injection procedure, just as it protects electrical or electronical or electromechanical components mounted to the conductive track foil 4, such as the aforementioned SMD component 9. In this manner it is achieved that the conductive track foil 4 just as the components 9 are not subjected to the pressure and the temperature of the injected plastics material, but need to withstand merely a substantially reduced pressure and merely the mold temperature. Accordingly, even less temperature-resistant components 9 and foil materials may be used. For the conductive track foil 4, practically all foils on the market may be used, such as, in particular, low-cost polyester foils, although, of course, also more expensive polyimide foils likewise are usable. Apart from the fact that also duroplastic materials may be used, preferably, however, all conventional thermoplastic materials, such as in particular polybutylene terephthalate (PBT) and polypropylene (PP), may be used as the material for the embedding injection-molded plastics enclosure 5.

As a modification of the embodiment of the casing 8 illustrated with its two casing parts 6, 7 prefabricated as separate parts, it is also conceivable to prefabricate the two casing parts 6, 7 in one piece, wherein they are interconnected along an edge, e.g. the edge 18 or 18', respectively, in FIG. 2, via an integral plastics film hinge not illustrated in detail, and thus can be folded into each other. Also these prefabricated casing parts 6, 7 may previously be injection-molded from the aforementioned plastics materials, in particular thermoplastic materials, such as PBT and PP.

On the other hand it is, however, also possible to prefabricate the casing parts or, generally, the stiffening elements, of metal or of metal sheet, respectively, particularly since the conductive track foils 4 usually comprise a cover lacquer coating so that the required electrical insulation is thereby ensured.

For the sake of completeness it should be mentioned that, although merely a very simple conductive track foil 4 with only one component 9 mounted thereto has been illustrated in FIGS. 1–4, the shapes and structures of the conductive track foil 4 and the conductive tracks 10 may, of course, be substantially more complex, and it is of course also possible to apply a plurality of components 9 on the conductive track foil 4 by soldering or crimping before the plastics material is injected therearound.

As a modification of the embodiment described it is, of course, also conceivable to apply the conductive track foil 4 on a simple stiffening element, e.g. corresponding to the upper casing part 7, or corresponding to the lower casing part 6. In this manner, too, with the conductive track foil 4 appropriately resting on this stiffening element 6, or 7, respectively, an undesired outward-bending and tearing as well as floating or displacement in the mold would be avoided. To retain the conductive track foil 4 on such a stiffening element having the form of a substantially congruent stiff board, a metal sheet or the like, several adhesion points or glue points could be provided distributed over the surface of a conductive track foil 4 or of the stiffening element 6, or 7, respectively. Moreover, holes could be provided in the conductive track foil 4, with corresponding knobs provided on the stiffening element 6 or 7, over which the conductive track foil 4 could be snapped with the openings, ensuring a snug fit of the conductive track foil 4 on its stiffening element. A further modification would consist in that the rim 13 of the lower casing part 6 is omitted and the conductive track foil 4 thus is "enclosed" between two plate-shaped elements.

In FIGS. 5–8, a different embodiment of the invention is shown in illustrations substantially corresponding to the previously explained FIGS. 1–4, in which different embodiment again the conductive track unit 21 is obtained by injecting plastics material around a conductive track foil 24 inserted in a casing 28. Again, two windows 22, 23 are provided for contacting conductive tracks 30 (cf. FIG. 6) on the conductive track foil 24, with corresponding window openings 22', 23' being provided in the one, upper casing part 27 of the casing 28 which, again, has two parts. This upper casing part 27 again is prefabricated as a lid to fit into the inner space or receiving space 34 of the lower, trough-shaped casing part 26, the conductive track foil 24 being inserted between these two casing parts 27, 26 (cf. in particular also FIG. 8). There, again, the lower, trough-shaped casing part 26 has an upwardly rising rim 33.

Figure 5:
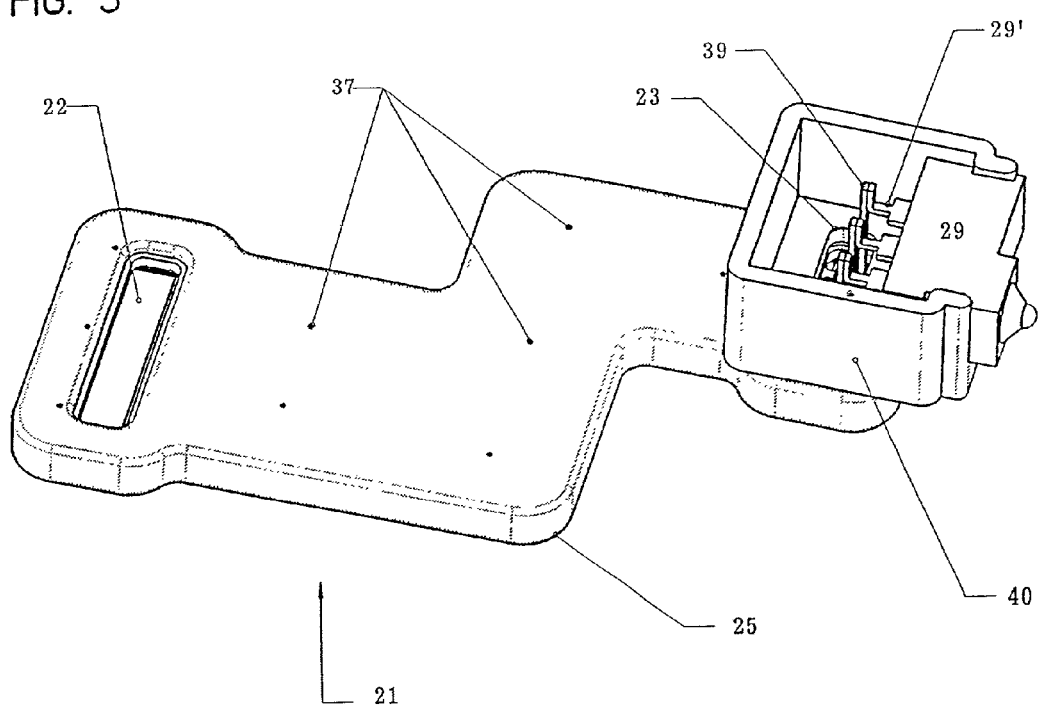
FIG. 5 shows another conductive track unit in a representation similar to FIG. 1 after having been injection-embedded in plastics, a micro-switch having been mounted as an electromechanical component in a separate receiving part.
Figure 9:
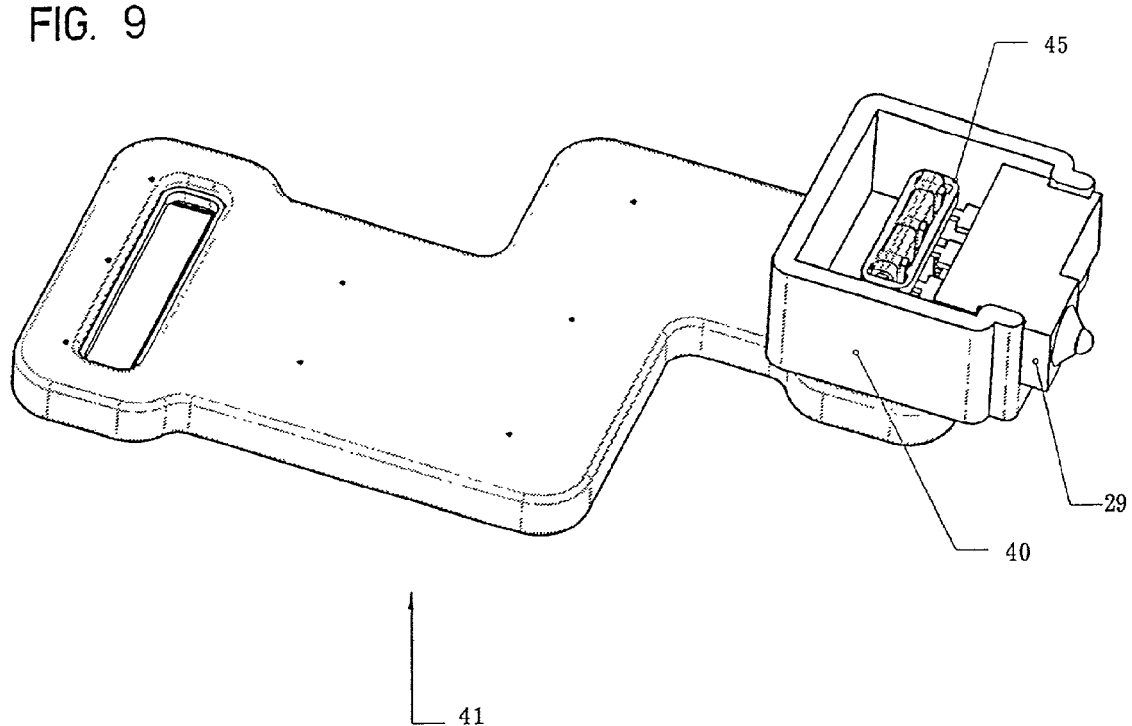
FIG. 9 is a representation of yet another conductive track unit after the embedding procedure.
Figure 10:
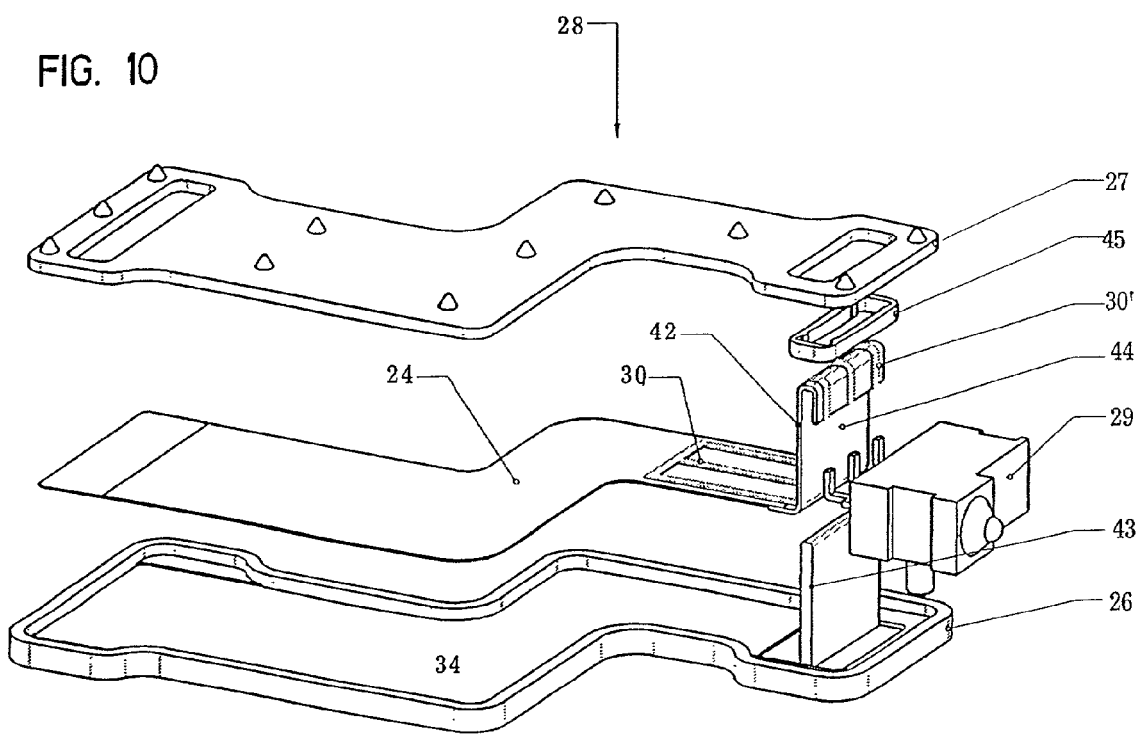
FIG. 10 shows the two casing parts and the conductive track foil of this conductive track unit in an exploded view, before being injection-embedded, wherein also the microswitch shown in FIG. 9 in a separate receiving part is illustrated.
Figures 11, 12:
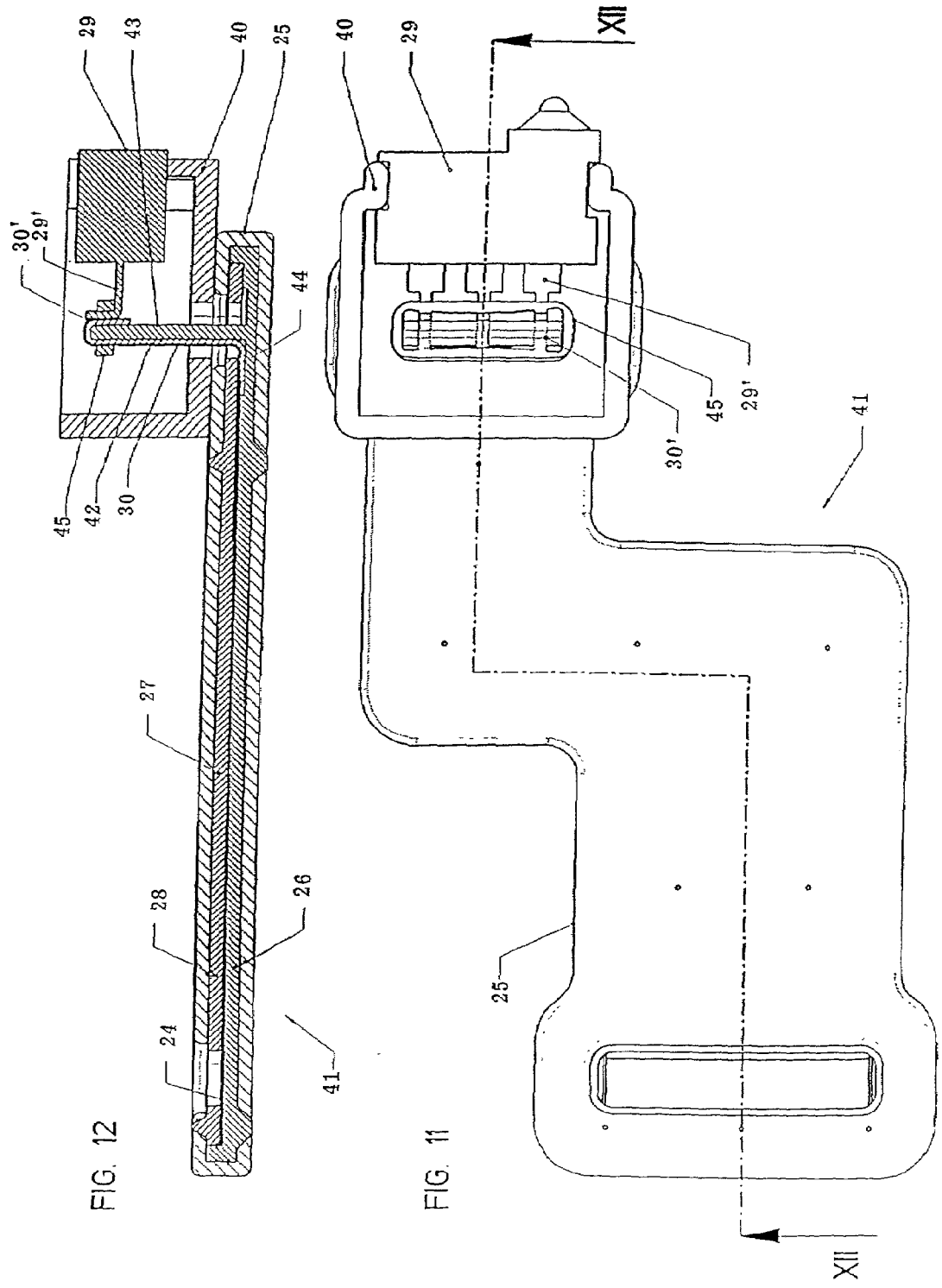
FIG. 11 shows a top view onto the conductive track unit according to FIG. 9.
FIG. 12 shows a section through this conductive track unit according to section line XII—XII of FIG. 11.

The conductive track foil 24 is accessible by end portions 31, 32 in the windows 22, 23, and, moreover, the two casing parts 26, 27 comprise conical, knob-shaped spacer elements 27 to retain the casing 28 including the conductive track foil 24 within the injection mold when the casing 28 with the conductive track foil 24 inserted therein—the latter being stiffened by the casing 28—is inserted in an injection mold to be injection-embedded in plastics material, cf. the injection-molded plastics enclosure 25 in FIGS. 5, 7 and 8.

Insofar, the embodiment according to FIGS. 5–8 corresponds to that according to FIGS. 1–4.

Additionally, in the conductive track unit 21 according to FIGS. 5–8, an outwardly accessible electrical or electromechanical component, here e.g. in the form of a micro-switch 29, is provided which is electrically connected via connectors 29' to contact tabs 39, e.g. by welding or by soldering; these contact tabs 39 in turn are contacted with their lower, angled ends with the conductive tracks 30 of the conductive track foil 24 through the one window 23, or 23', respectively, e.g. by soldering or by crimping, as is known per se. To fix the component or micro-switch 29, respectively, a separate receiving part 40 in which the component 29 is clampingly retained, is provided which, at its bottom side, has an opening not designated in detail in alignment with the window 23 for the contact tabs 39 to pass therethrough. This receiving part 40 may be a prefabricated injection-molded part which also is injection-molded when the casing 28 with the conductive track foil 24 inserted therein is embedded in the plastics material. It is also conceivable to fill the inner space of the receiving part 40 with plastics material so as to tightly enclose the contact tabs 39. As a variation, it is also possible to form a plastics receiving part 40 by injection-molding directly instead of using a prefabricated receiving part 40, if the casing 28 with the conductive track foil 24 is injection-embedded so as to integrate the component 29 in the conductive track unit 21 by aid of a uniform plastics embedding material 25.

Of course, also in the embodiment according to FIGS. 5–8, further electrical or electronical components may be applied to the conductive track foil 24 and covered by a protective hood similar to the protective hood 15 according to FIGS. 2 and 4, when the plastics material is injected.

The same holds for the embodiment according to FIGS. 9–12, which largely corresponds to that of FIGS. 5–8 so that merely the differences relative to the latter in connection with the attachment of the micro-switch provided as an electromechanical component 29 and its electrical connection to the conductive track foil 24 are to be explained. As far as necessary, the elements corresponding to like ones according to FIGS. 5–8 have the same reference numbers as in FIGS. 5–8.

In the conductive track unit 41 according to FIGS. 9–12, the conductive track foil 24 has its end region 42, which is on the right-hand side in FIGS. 9–12, angled upward by 90° and then bent back by 180° such that with this bent region 42, it may be slid over a web-type projection 43 of the lower casing part 26 when it is inserted in the receiving space 34 of the lower, trough-shaped casing part 26. Subsequently, the upper, lid-shaped casing part 27 is applied, or inserted, respectively, as in the two previous embodiments. The bent end region 42 may also be provided with a reinforcing layer 44 at its side facing away from the conductive tracks 30, as is apparent from FIG. 10. When the casing 28 with the conductive track foil 24 inserted therein and secured against an outward bending is injection-embedded in the plastics material 25, again a receiving part 40 for the component 29 (micro-switch) may be fixed by injection-molding, with the web-shaped projection 43 including the angled end region 42 of the conductive track foil 24 projecting upwardly in the interior of this receiving part 40. The component 29 is then inserted into the receiving part 40, its connections 29' with the ends 30' of the conductive tracks 30 getting into contact on the bent end region 42 of the conductive track foil 24, as is particularly visible in FIG. 12. Subsequently, a safety ring 45 is slipped on in the region of contact for mutually clamping the conductive track regions 30' and the connections 29', as is also seem most clearly in FIG. 12, yet can also be taken from FIG. 9. Instead of this mechanical safety device with ring 45 which, in top view, is approximately rectangular, however, also casting or injection-molding of plastics material may be provided, it being, moreover, also conceivable to do without a separate prefabricated receiving part 40 and to directly fix the component 29 on the remaining conductive track unit 41 during the finishing of the injection-molding of the conductive track unit 41.

Of course, also any other desired electrical, electronical or electromechanical components may be mounted to the conductive track unit, such as plugs, sensors, small motors etc., depending on the respective purpose of use. As particular field of use for the present conductive track units, equipped with components, in particular door lock units of motor vehicles and the like are to be mentioned, where an optimum sealing relative to outer influences, such as water, is important.

Figure 13:
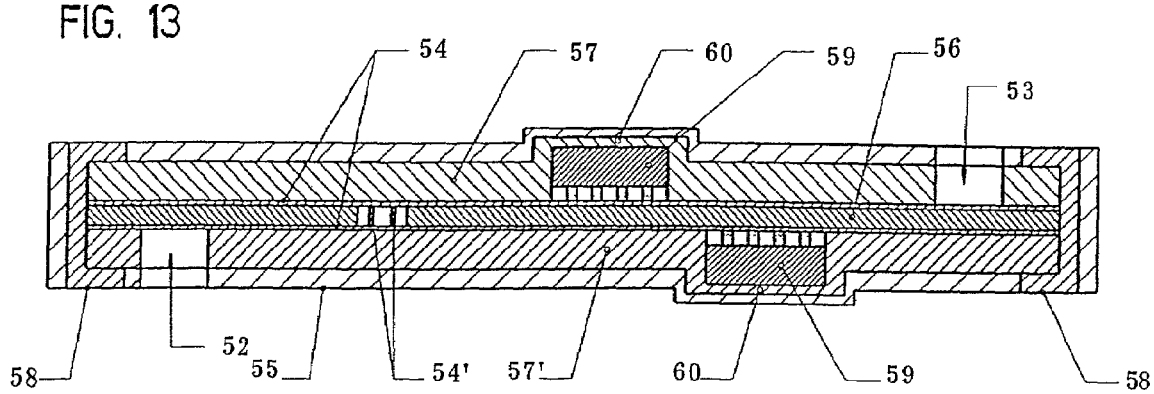
FIG. 13 shows a comparable longitudinal section through yet another—sandwich-like—conductive track unit.

In FIG. 13, an electrically conductive track unit 51 having a sandwich structure is shown, wherein, e.g., two conductive track foils 54 capable of being contacted from different sides via two windows 52, 53 are arranged which are connected with each other via contact tabs 54'. These contact tabs 54' are provided in an opening in a centrally arranged plate-shaped stiffening element 56, and on the outer side the sandwich structure is closed by two further plate-shaped stiffening elements 57, 57'. This unit comprised of conductive track foils 54 and stiffening elements 56, 57, 57' may, e.g., be held together with the assistance of rim-side prefabricated plastics clamps 58 for the injecting-around procedure, cf. the plastics material 55, wherein the plastics clamps may simultaneously serve as spacer elements for spaced retention in the injection mold.

In FIG. 13, moreover, two components 59 electrically connected to the conductive track foils 54 are shown, wherein the number and arrangement of these components may, of course, vary. The components 59 in turn are protectedly arranged underneath protective hoods 60 molded on the plate-shaped stiffening elements 57, 57' when the sandwich structure is injection-embedded in the plastics material 55.

In the previous exemplary embodiments, such as that according to FIGS. 1–4, spacer elements, such as the knob-shaped spacer elements 17 according to FIGS. 1–4, integrated in the respective conductive track unit have been explained. In addition thereto or thereinstead, however, also spacers provided on the mold may be used, and such an exemplary embodiment is schematically shown in FIGS. 14 and 15 in a sectional view according to section line XIV—XIV in FIG. 15, and in a top view, respectively. In principle, these are the conductive track unit according to FIG. 1–4 with the two casing parts 6, 7 as stiffening elements is provided here, too, with the conductive track foil 4 being inserted between these two casing parts 6 and 7. This embedding unit comprised of parts 4, 6 and 7, together with e.g., an electronic component 9, is embedded in plastics material 5 by injection-molding, the mold-side spacers having the form of supporting cores 62 being provided to retain the unit 4, 6, 7, 9 in the injection mold (which is not further illustrated in detail in FIGS. 14 and 15), which spacers 62 abut the outer surfaces of the casing parts 6 and 7, respectively, and project from the mold surfaces of the injection mold. In the finished, embedded product, i.e. in the conductive track unit 1, corresponding holes will remain at the sites of these supporting core spacers 62 when the latter are retracted in the mold and the conductive track unit 1 is removed from the mold. Nevertheless, in the finished conductive track unit 1, the desired sealing for the conductive track foil 4 will be ensured by the embedment in combination with the casing parts 6, 7.

What is claimed is:

1. A method of embedding at least one flexible conductive track foil in a plastics material, said method comprising the steps of:

providing at least one flexible conductive track foil which by itself is not adapted for being embedded in plastics material by injection molding,
   providing a separate, prefabricated stiffening element,
   separating supporting said at least one flexible conductive track foil by said stiffening element to resist displacement and bending of said foil,
   placing said at least one flexible conductive track foil supported by the separate prefabricated stiffening element in an injection mold, and
   injection molding plastics material around said at least one flexible conductive track foil and said stiffening element, in the injection mold, and wherein said at least one flexible conductive track foil is prevented by said stiffening element from undergoing displacement and bending in the injection mold during the injection molding of the plastics material.

2. A method as set forth in claim 1, wherein said at least one flexible conductive track foil is fastened to said stiffening element.

3. A method as set forth in claim 1, wherein a trough-shaped stiffening element is provided and said at least one flexible conductive track foil is laid into said trough-shaped stiffening element.

4. A method as set forth in claim 3, wherein said prefabricated stiffening element is a casing having an inner space and said flexible conductive track foil is provided in said inner space of said casing before said plastics material is injection-molded therearound.

5. A method as set forth in claim 4, wherein said casing is prefabricated in two parts.

6. A method as set forth in claim 5, wherein said two parts of said casing area trough-shaped part and a lid part.

7. A method as set forth in claim 5, wherein said two parts of said casing are prefabricated as separate parts.

8. A method as set forth in claim 5, wherein said two parts of said casing are interconnected by an integral hinge and are prefabricated in one piece.

9. A method as set forth in claim 1, further comprising attaching at least one component on said flexible conductive track foil before said plastics material is injection-molded therearound.

10. A method as set forth in claim 9, wherein said at least one component is an electrical component.

11. A method as set forth in claim 10, wherein said electrical component is a sensor.

12. A method as set forth in claim 9, wherein said at least one component is an electromechanical component.

13. A method as set forth in claim 12, wherein said electromechanical component is a nucro-switch.

14. A method as set forth in claim 9, wherein said stiffening element is prefabricated with a receiving means for said at least one component.

15. A method as set forth in claim 14, wherein said receiving means is hoodshaped.

16. A method as set forth in claim 9, wherein at least one receiving means for said component is produced on said stiffening element by injection-molding when said plastics material is injection-molded around said stiffening element and said conductive track foil.

17. A method as set forth in claim 16, wherein said component is a micro-switch.

18. A method as set forth in claim 1, wherein said stiffening element is prefabricated with spacer elements and said injection mold has mold surfaces, said spacer elements keeping said stiffening element in said injection mold at a distance from said mold surfaces.

19. A method as set forth in claim 1, wherein said injection mold has mold surfaces, and wherein supporting cores are used in said injection mold when said plastics material is injection-molded around said stiffening element and said flexible conductive track foil so as to keep said stiffening element at a distance from said mold surfaces of said injection mold.

20. A method as set forth in claim 1, wherein at least two flexible conductive track foils and associated stiffening elements are superposed in sandwich-like manner and embedded in plastics material by injection-molding.

21. A method as set forth in claim 1, wherein said plastics material injection-molded around said at least one conductive track foil and said stiffening element is a thermoplastic material.

22. A method as set forth in claim 21, wherein said thermoplastic material is selected from the group consisting of PBT (polybutylene-terephthalate) and PP (polypropylene).

23. A method as set forth in claim 1, further comprising bending said flexible conductive track foil in a region and fastening said bent region to a projection of said stiffening element before injection-molding said plastics material around said flexible conductive track foil and said stiffening element.

24. A method as set forth in claim 23, further comprising slipping a ring element under clamping onto said bent region so as to secure said bent region of the flexible conductive track foil on said projection of said stiffening element after plastics material has been injected therearound, with said bent region left clear.

25. An electrically conductive track unit comprising at least one plastics-embedded conductive track foil, wherein said conductive track foil is accommodated by a plastics-embedded stiffening element, and an injection molded plastics material around said foil and stiffening element, said foil and said stiffening element being prefabricated as separate parts which are united by said plastics material during injection molding, said stiffening element being prefabricated and constructed and arranged to support said at least one conductive, flexible track foil in a retained and stabilized position prior to and after placement in a mold for injection molding of said plastics material and preventing displacement of the foil during the injection molding.

26. A conductive track unit as set forth in claim 25, and further comprising at least one plastics-embedded component.

27. A conductive track unit as set forth in claim 26, wherein said component is an electrical component.

28. A conductive track unit as set forth in claim 26, wherein said component is an electromechanical component.

29. A conductive track unit as set forth in claim 25, wherein said stiffening element is a casing.

30. A conductive track unit as set forth in claim 29, wherein windows are provided in said casing as well as in said plastics embedding so as to keep conductive contact surfaces of said conductive track foil clear for contacting thereof.

31. A conductive track unit as set forth in claim 29, wherein said casing includes a hood-shaped receiving means accommodating a component connected with said conductive track foil.

32. A conductive track unit as set forth in claim 29, further comprising a plastics embedded component, and a receiving means for said component, said receiving means being made of said plastics embedding material and being separate from said casing.

33. A conductive track unit as set forth in claim 29, further comprising spacer elements externally provided on said casing, said spacer elements being embedded in said plastics material so as to end flush with the external surface of said plastics material.

34. A conductive track unit as set forth in claim 33, wherein said spacer elements are knob-shaped.

35. An embedding unit to be used in a method of embedding at least one flexible conductive track foil in a plastics material, wherein a prefabricated stiffening element having the form of a casing is provided, said casing comprising two matching casing parts with a receiving space provided therebetween when the casing parts are in the assembled state, said casing accommodating said at least one flexible conductive track foil in said receiving space thereof and securing said conductive track foil against bending, said track foil when secured in said casing in the assembled state forming said embedding unit which is adapted for introduction into an injection mold, said casing protecting the foil against bending prior to and during introduction into said mold as well as during injection of plastics material into said mold.

36. An embedding unit as set forth in claim 35, wherein at least one casing part includes a window for contacting said conductive track foil.

37. An embedding unit as set forth in claim 36, wherein at least one casing part has a projection projecting through a window provided in the respective other casing part when said casing parts are in the assembled state.

38. An embedding unit as set forth in claim 37, wherein said projection is web-shaped.

39. An embedding unit as set forth in claim 35, wherein both casing parts are formed with external spacer elements.

40. An embedding unit as set forth in claim 39, wherein said spacer elements are knob-shaped.

41. An electrically conductive track unit comprising:
at least one flexible conductive track foil which by itself is not adapted for being embedded in plastics material by injection molding,
a separate, prefabricated stiffening element supporting said at least one flexible conductive track foil to resist displacement and bending of said foil,
said at least one flexible conductive track foil supported by the separate prefabricated stiffening element being supported as a unit in an injection mold, and being embedded all around by an injection molded plastics material introduced in said mold around said at least one flexible conductive track foil and said stiffening element, in the injection mold, and
wherein
said at least one flexible conductive track foil is prevented by said stiffening element from undergoing displacement and bending in the injection mold during the injection molding of the plastics material.

* * * * *